(12) United States Patent
Chiu et al.

(10) Patent No.: US 11,637,194 B2
(45) Date of Patent: Apr. 25, 2023

(54) FINFET TRANSISTOR CUT ETCHING PROCESS METHOD

(71) Applicant: Shanghai Huali Integrated Circuit Corporation, Shanghai (CN)

(72) Inventors: Yenchan Chiu, Shanghai (CN); Yingju Chen, Shanghai (CN); Liyao Liu, Shanghai (CN); Chanyuan Hu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 219 days.

(21) Appl. No.: 16/895,083

(22) Filed: Jun. 8, 2020

(65) Prior Publication Data

US 2021/0119023 A1    Apr. 22, 2021

(30) Foreign Application Priority Data

Oct. 17, 2019    (CN) .......................... 201910986166.8

(51) Int. Cl.
*H01L 29/66*  (2006.01)
*H01L 21/02*  (2006.01)
(Continued)

(52) U.S. Cl.
CPC .... *H01L 29/66795* (2013.01); *H01L 21/0273* (2013.01); *H01L 21/02271* (2013.01);
(Continued)

(58) Field of Classification Search
CPC ........... H01L 29/66795; H01L 29/1604; H01L 21/02271; H01L 21/0273; H01L 21/30604;
(Continued)

(56) References Cited

U.S. PATENT DOCUMENTS 6,165,695 A * 12/2000 Yang ................... H01L 21/0276
                                                        430/316
7,998,357 B2 * 8/2011 Cho .................. H01L 21/02282
                                                        438/689
(Continued)

FOREIGN PATENT DOCUMENTS

| CN | 103594345 A | 2/2014 |
| CN | 104319291 A | 1/2015 |
| CN | 104409444 A | 3/2015 |

OTHER PUBLICATIONS

Aug. 20, 2021—CN—CNIPA First Search Report Appn 201910986166.8.

*Primary Examiner* — Dale E Page
*Assistant Examiner* — Quovaunda Jefferson
(74) *Attorney, Agent, or Firm* — Banner & Witcoff, Ltd.

(57) ABSTRACT

The present disclosure discloses a FinFET transistor cut etching process method, comprising: step 1, forming a first photoresist pattern to define a cut etching region of the FinFET transistor; step 2, forming a second amorphous semiconductor pattern; step 3, forming a first dielectric layer and a first groove; step 4, forming a second dielectric layer that fully fills the first groove; step 5, performing CMP using the second amorphous semiconductor layer as a stop layer, so as to form a sidewall and a second dielectric layer strip; step 6, performing self-alignment to remove each side wall; step 7, performing a wet process to remove the amorphous semiconductor strip; and step 8: performing etching by using each second dielectric layer strip as a mask, so as to form a fin and achieve cut etching of the FinFET transistor. The present disclosure can enlarge the process window and reduce the process cost.

15 Claims, 12 Drawing Sheets

(51) Int. Cl.
*H01L 21/027* (2006.01)
*H01L 21/306* (2006.01)
*H01L 21/3065* (2006.01)
*H01L 21/308* (2006.01)
*H01L 29/16* (2006.01)

(52) U.S. Cl.
CPC ...... *H01L 21/3065* (2013.01); *H01L 21/3081* (2013.01); *H01L 21/30604* (2013.01); *H01L 21/30625* (2013.01); *H01L 29/1604* (2013.01)

(58) Field of Classification Search
CPC ........... H01L 21/30625; H01L 21/3065; H01L 21/3081; H01L 21/3086; H01L 21/823431
See application file for complete search history.

(56) References Cited

U.S. PATENT DOCUMENTS

| | | | | |
|---|---|---|---|---|
| 8,557,675 | B2* | 10/2013 | LiCausi | H01L 29/66795 |
| | | | | 257/E21.038 |
| 9,196,500 | B2* | 11/2015 | Lin | H01L 21/3086 |
| 10,008,497 | B2* | 6/2018 | Lee | A61B 17/285 |
| 2008/0014752 | A1* | 1/2008 | Cha | H01L 21/32139 |
| | | | | 257/E21.235 |
| 2008/0090418 | A1* | 4/2008 | Jeon | H01L 21/3086 |
| | | | | 438/689 |
| 2017/0103891 | A1* | 4/2017 | Lee | H10B 12/01 |
| 2019/0057870 | A1* | 2/2019 | Shih | H01L 21/31144 |

\* cited by examiner

FINFET TRANSISTOR CUT ETCHING PROCESS METHOD

CROSS REFERENCE TO RELATED APPLICATIONS

The present application claims priority to and the benefit of Chinese Patent Application No. CN 201910986166.8 filed on Oct. 17, 2019, the disclosure of which is incorporated herein by reference in its entirety as part of the present application.

TECHNICAL FIELD

The disclosure relates to the field of manufacturing of semiconductor integrated circuits, in particular to a FinFET transistor cut etching process method.

BACKGROUND

Figure 1A:
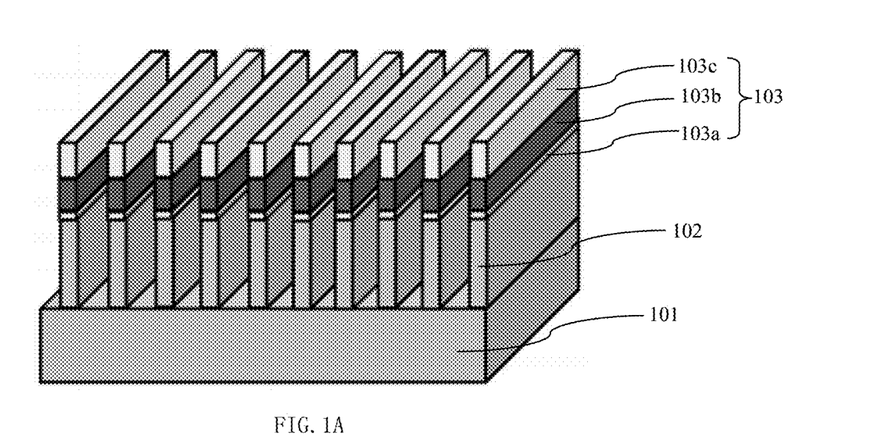
FIG. 1A is a schematic diagram of a three-dimensional structure of a device on which a fin has been formed and has not been cut-etched in an existing FinFET transistor cut etching process method.
Figure 1B:
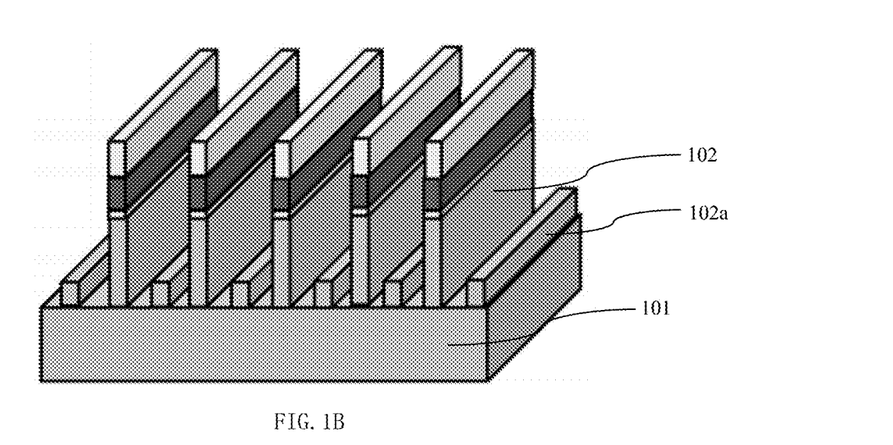
FIG. 1B is a schematic diagram of a three-dimensional structure of a cut-etched device in the existing FinFET transistor cut etching process method.

FIG. 1A is a schematic diagram of a three-dimensional structure of a device on which a fin has been formed and has not been cut-etched in an existing FinFET transistor cut etching process method. FIG. 1B is a schematic diagram of a three-dimensional structure of a cut-etched device in the existing FinFET transistor cut etching process method. FIGS. 2A-2H are schematic diagrams of the device structure in each step of the existing FinFET transistor cut etching process method. The existing FinFET transistor cut etching process method includes the following steps.

Figure 2A:
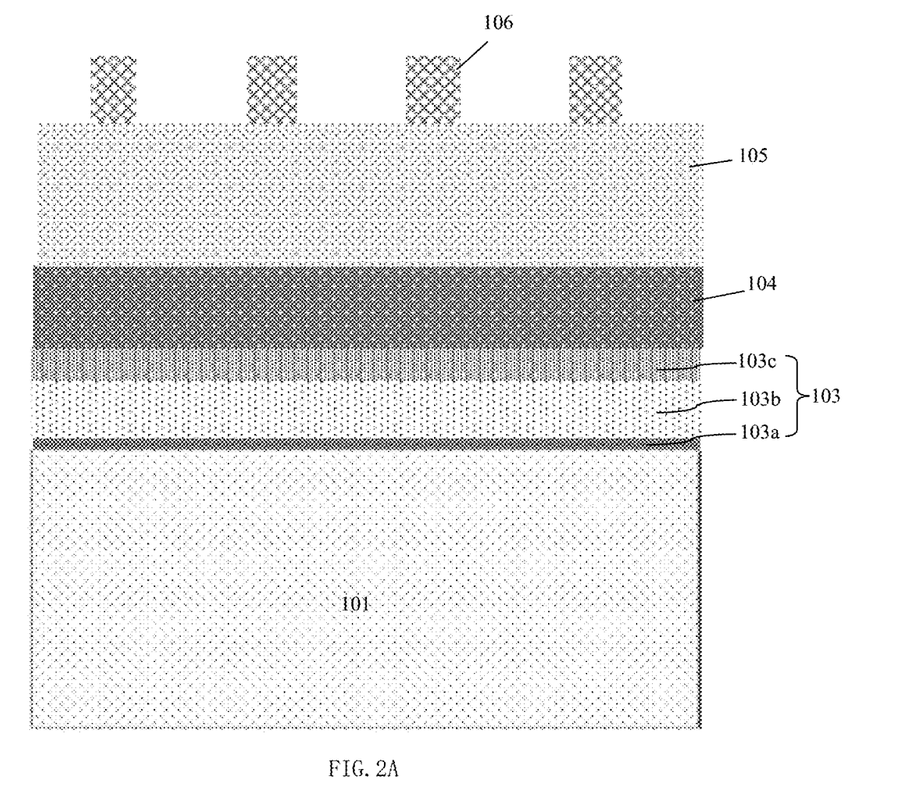
FIGS. 2A-2H are schematic diagrams of sectional structures of the device in each step of the existing FinFET transistor cut etching process method.

Step 1, as shown in FIG. 2A, a semiconductor substrate 101 is provided, wherein a first hard mask 103 and a second amorphous semiconductor layer 104 are sequentially formed on the surface of the semiconductor substrate 101.

A first photoresist pattern is formed by means of a photolithographic process to define a formation region of the fin 102 of the FinFET transistor, and the first photoresist pattern is formed by an arrangement of a plurality of photoresist strips 106.

Generally, a Tri-layer structure is used for forming the first photoresist pattern, the Tri-layer is formed by stacking spin on carbon (SOC), a silicon contained hard mask (SiHM), and a photoresist, and the reference numeral 105 in FIG. 2A represents a stacking structure of SOC and SiHM in the Tri-layer structure.

Generally, the semiconductor substrate 101 is a silicon substrate, and the material of the second amorphous semiconductor layer 104 is amorphous silicon.

The material of the first hard mask 103 includes an oxide layer or a nitride layer. Preferably, the first hard mask 103 includes a third oxide layer 103a, a fourth nitride layer 103b, and a fifth oxide layer 103c which are sequentially stacked.

Figure 2B:
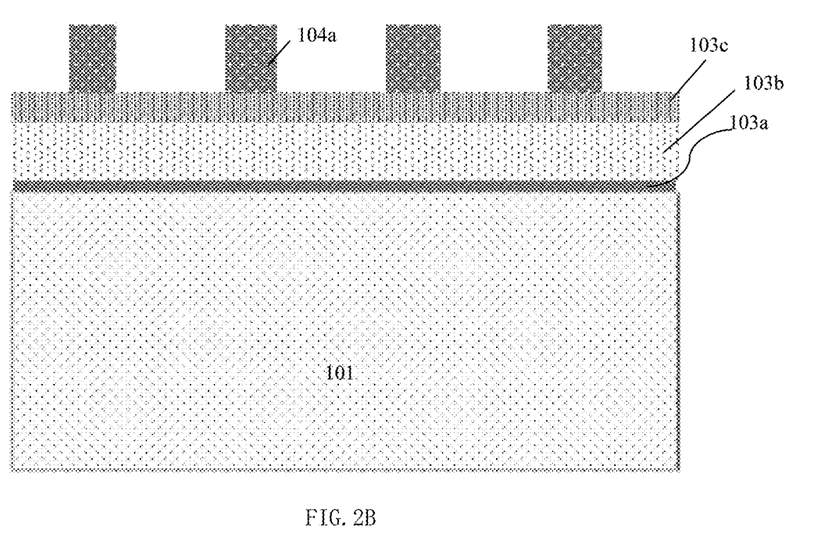

Step 2, as shown in FIG. 2B, the second amorphous semiconductor layer 104 is etched by using the first photoresist pattern as a mask, so as to form a second amorphous semiconductor pattern, wherein the second amorphous semiconductor pattern is formed by an arrangement of a plurality of amorphous semiconductor stripes 104a, and the amorphous semiconductor stripes 104a are defined by the photoresist stripes 106.

Generally, the second amorphous semiconductor layer 104 is etched by means of a dry etching process.

Figure 2C:
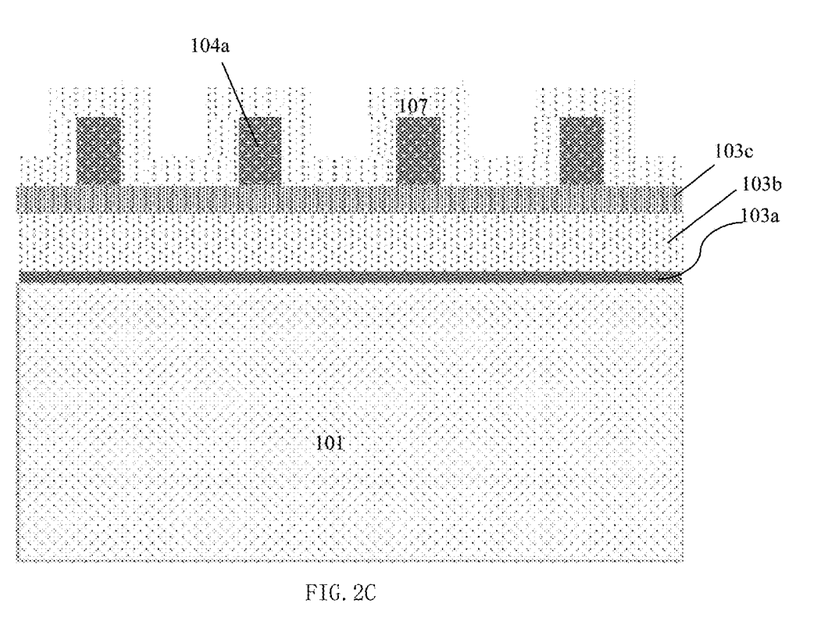

Step 3, as shown in FIG. 2C, a first dielectric layer 107 is formed, wherein the first dielectric layer 107 covers a top surface and a side surface of the amorphous semiconductor strip 104a, and a surface of the first hard mask 103 between the amorphous semiconductor strips 104a. Generally, there is an interval between the first dielectric layers 107 on the side surfaces of the amorphous semiconductor strips 104a.

Generally, the first dielectric layer 107 is a nitride layer.

Figure 2D:
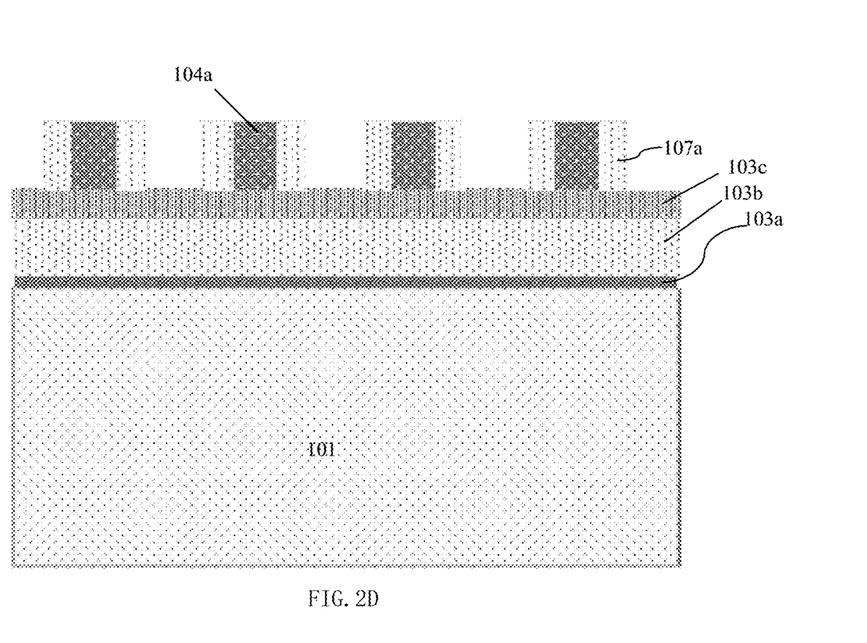

Step 4, as shown in FIG. 2D, the first dielectric layer 107 is fully etched, and a side wall 107a composed of only the first dielectric layer 107 on the side surface of the amorphous semiconductor strip 104a is formed.

Figure 2E:
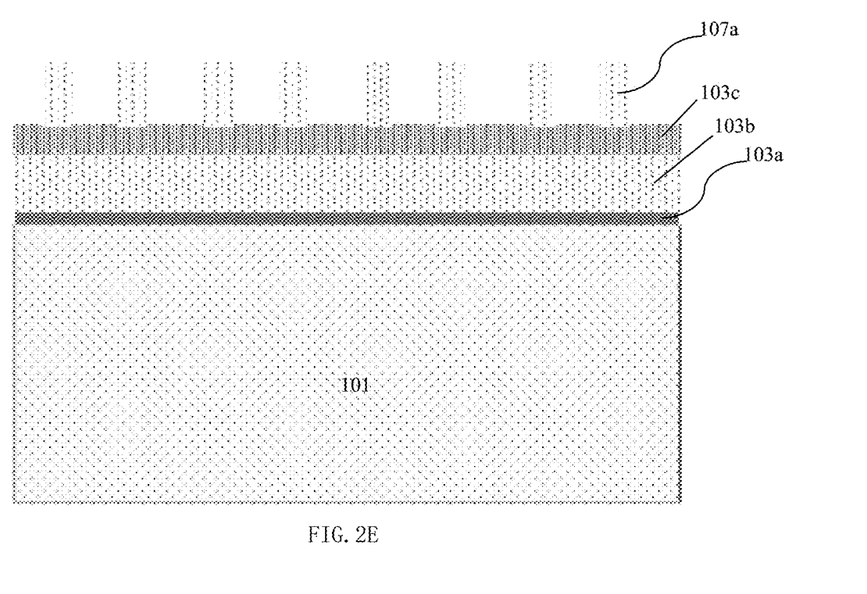

Step 5, as shown in FIG. 2E, the amorphous semiconductor strip 104a is directly removed thereafter, and a pattern mask composed of the side wall 107a is formed.

Figure 2F:
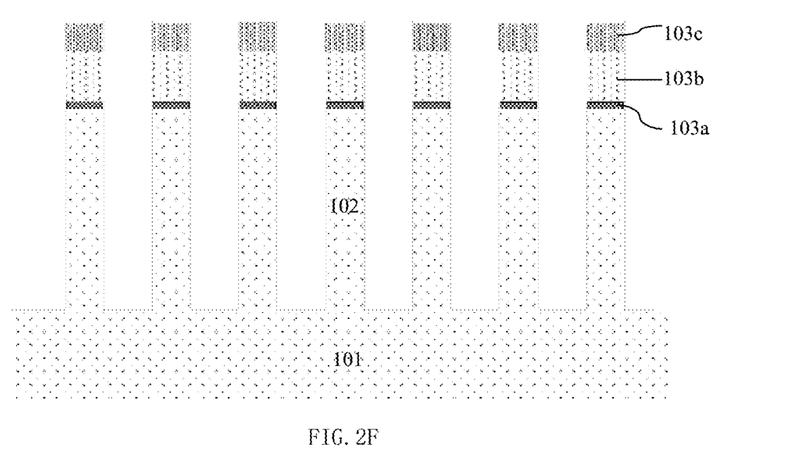

Step 6, as shown in FIG. 2F, a pattern composed of the side wall 107a is used as a mask for etching to form the fin 102. For the three-dimensional structure of the fin 102, reference may be made to FIG. 1A.

Figure 2G:
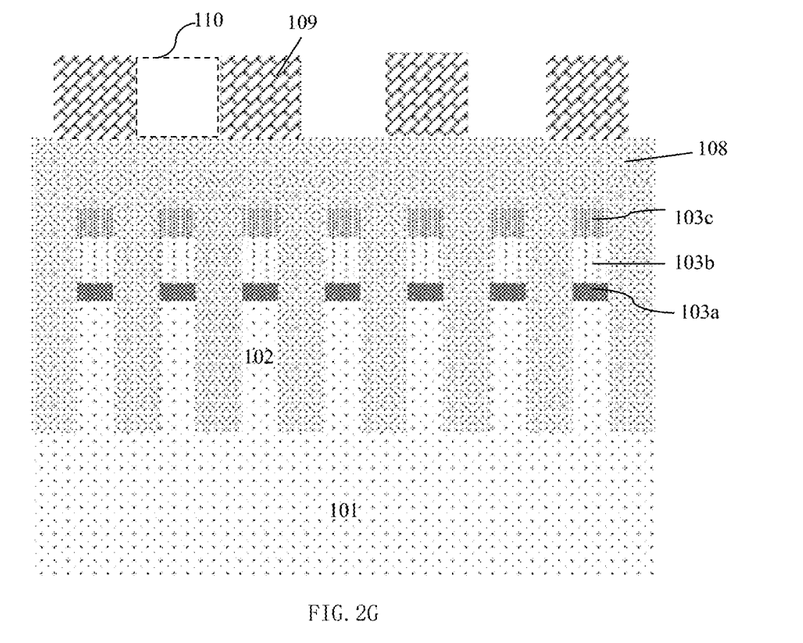

Step 7, as shown in FIG. 2G, a second photolithographic process is performed to form a second photoresist pattern, so as to define a cut etching region of the FinFET transistor, wherein the second photoresist pattern is formed by an arrangement of a plurality of photoresist stripes 109. The cut etching region is as shown in a dashed line box 110.

Generally, a Tri-layer structure is used for forming the second photoresist pattern, and the reference numeral 108 in FIG. 2G represents a stacking structure of SOC and SiHM in the Tri-layer structure. The stacking structure 108 of SOC and SiHM fully fills the region between all of the fins 102.

Figure 2H:
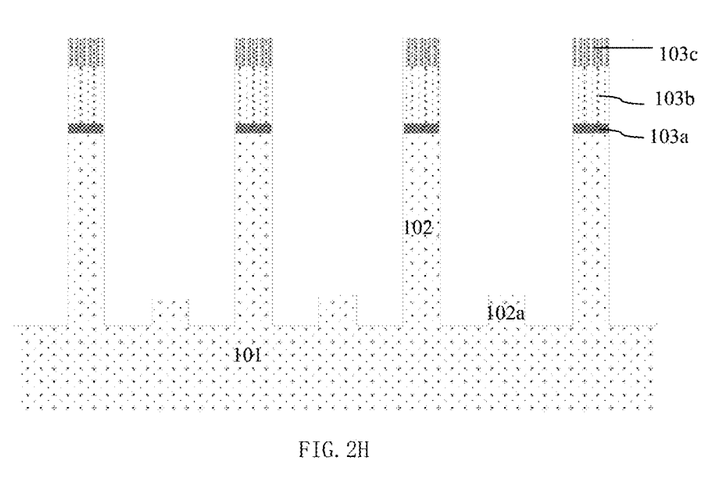

Step 8, as shown in FIG. 2H, the second photoresist pattern is used as a mask for etching, so as to etch away the fin 102 in the cut etching region, thereby achieving cut etching of the FinFET transistor.

In FIG. 2H, reference numeral 102a represents the fin etched away. It can be seen that the fin has a relatively large height and a relatively small width, that is, has a relatively large height-to-width ratio, which makes the etching process of the fin more difficult and the process window smaller.

BRIEF SUMMARY

The technical problem to be solved by the present disclosure is to provide a FinFET transistor cut etching process method, which can enlarge a process window.

In order to solve the above technical problem, the FinFET transistor cut etching process method provided by the present disclosure comprises the following steps:

step 1, providing a semiconductor substrate, the semiconductor substrate having a surface where a first hard mask and a second amorphous semiconductor layer are sequentially formed thereon, and forming a first photoresist pattern by means of a photolithographic process to define a cut etching region of the FinFET transistor, wherein the first photoresist pattern is formed by an arrangement of a plurality of photoresist strips, the cut etching region corresponds to a strip region in which a fin is removed, each fin presents a strip structure, and in a plan view, the photoresist strip and the fin present an alternate arrangement structure;

step 2, etching the second amorphous semiconductor layer by using the first photoresist pattern as a mask, so as to form a second amorphous semiconductor pattern, wherein the second amorphous semiconductor pattern is formed by an arrangement of a plurality of amorphous semiconductor stripes, and the amorphous semiconductor stripes are defined by the photoresist stripes;

step 3, forming a first dielectric layer, wherein the first dielectric layer covers a top surface and a side surface of the amorphous semiconductor strip, and a surface of the first hard mask between the amorphous semiconductor strips, and there is an interval between the first dielectric layers on the side surfaces of the amorphous semiconductor strips and a first groove is formed therefrom;

step 4, forming a second dielectric layer, wherein the second dielectric layer fully fills the first groove and extends onto a surface of the first dielectric layer outside the first groove;

step 5, performing planarization by means of a chemical mechanical polishing process using the second amorphous semiconductor layer as a stop layer, after the planarization, forming a side wall composed of the first dielectric layer on a side surface of the amorphous semiconductor stripe, and forming a second dielectric layer strip composed of the second dielectric layer filled in the first groove between the side walls, wherein the second dielectric layer strip defines a corresponding formation region of fin;

step 6, performing self-alignment by using each amorphous semiconductor strip and each second dielectric layer strip as masks, so as to remove each side wall;

step 7, performing a wet process to remove each amorphous semiconductor strip; and step 8, sequentially etching the first hard mask and the semiconductor substrate by using each second dielectric layer strip as a mask, so as to form the fin and achieve cut etching of the FinFET transistor.

A further improvement is that the semiconductor substrate is a silicon substrate.

A further improvement is that the material of the second amorphous semiconductor layer is amorphous silicon.

A further improvement is that the material of the first hard mask comprises an oxide layer or a nitride layer.

A further improvement is that the first hard mask comprises a third oxide layer, a fourth nitride layer, and a fifth oxide layer which are sequentially stacked.

A further improvement is that the first dielectric layer is a nitride layer.

A further improvement is that the second dielectric layer is an oxide layer.

A further improvement is that in step 2, the second amorphous semiconductor layer is etched by means of a dry etching process.

A further improvement is that in step 3, the thickness of the first dielectric layer defines an interval between the fin and the cut etching region.

A further improvement is that in step 3, the first dielectric layer is grown by means of an atomic layer deposition method.

A further improvement is that in step 4, the second dielectric layer is formed by means of a chemical vapor deposition process.

A further improvement is that in step 6, the side wall is removed by means of a dry etching process.

A further improvement is that in step 8, the first hard mask and the semiconductor substrate are sequentially etched by means of a dry etching process.

A further improvement is that in step 7, an etching solution of the wet process comprises TMAH and $NH_4OH$.

A further improvement is that the method further comprises a step of forming a gate structure of the FinFET transistor after step 8, the gate structure comprising a gate dielectric layer and a gate conductive material layer and covering a side surface and a top surface of the fin; and further comprises a step of forming a source region and a drain region in the fins on two sides of the gate structure.

In the prior art, after a fin is formed by means of photolithographic defining and etching, a cut etching region of the FinFET transistor is defined by means of photolithography, and then the fin in the cut etching region is etched. Dissimilarly, in the present disclosure, photolithographic defining of the fin is not performed directly, but defining of the cut etching region of the FinFET transistor is directly performed, the cut etching region is defined to be as the same as a strip pattern of the fin that needs to be removed in the prior art, and then a reverse double patterning production process is performed to define the pattern mask composed of the amorphous semiconductor stripe and the pattern mask composed of the second dielectric layer stripe, wherein the pattern mask composed of the amorphous semiconductor stripe, that is, the second amorphous semiconductor pattern, is formed by means of photolithographic defining and an etching process of the second amorphous semiconductor layer, and the pattern mask composed of the second dielectric layer stripe is formed by first forming the first dielectric layer and then performing filling of the second dielectric layer, the chemical mechanical polishing process, and the self-alignment removal process of the first dielectric layer; after a double patterning mask structure is formed, the amorphous semiconductor strip can be removed by means of the wet process, and then etching of semiconductor substrate is performed by means of the pattern mask composed of the second dielectric layer strip, so as to form the fin and achieve the cut etching of the FinFET transistor. It can be known from the above that the cut etching process of the present disclosure can be achieved by performing the photolithographic defining only once, and the pattern mask composed of the amorphous semiconductor stripe corresponding to the cut etching region is removed by means of the wet process before the etching of the semiconductor substrate. Compared with the prior art in which an independent photolithography process is required to define the cut etching region and dry etching is required to remove the relatively high fin in the cut etching region, the process window of the wet process for removing the amorphous semiconductor strip in the present disclosure is greatly enlarged. Therefore, the present disclosure can enlarge the process window and reduce the process cost.

BRIEF DESCRIPTION OF THE DRAWINGS

The disclosure is further expounded below with reference to the accompanying drawings and specific embodiments.

DETAILED DESCRIPTION

Figure 3:
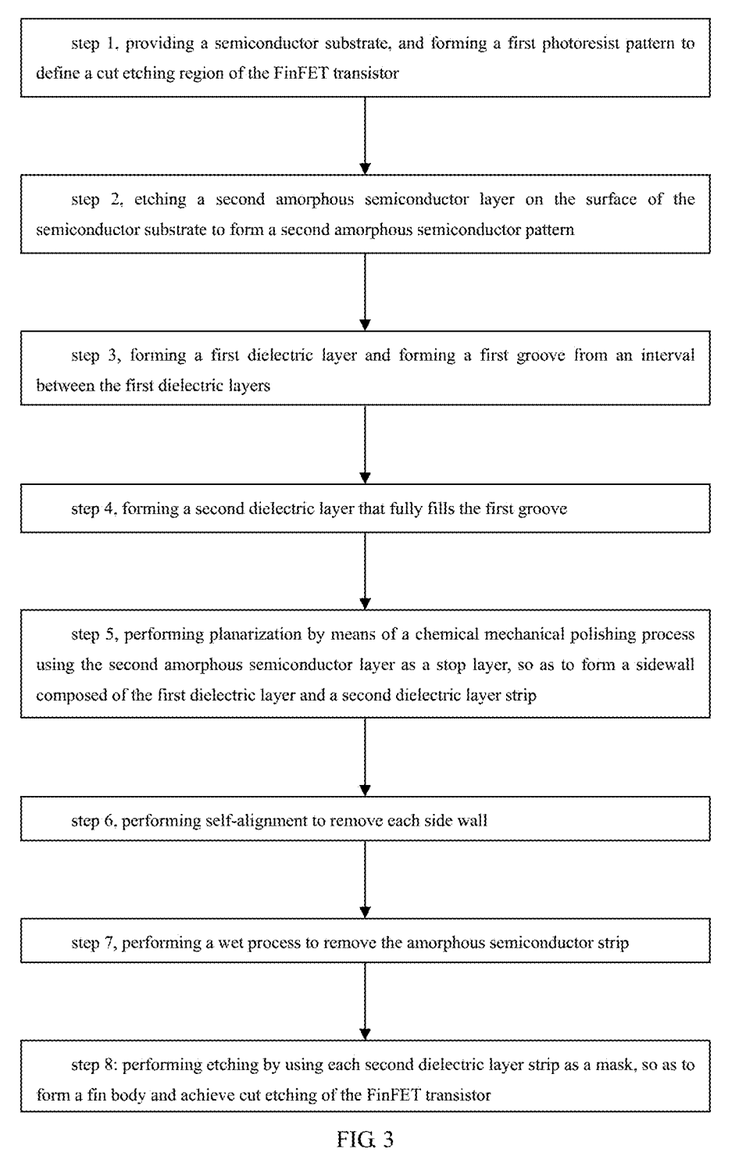
FIG. 3 is a flowchart of a FinFET transistor cut etching process method in an embodiment of the present disclosure.

FIG. 3 is a flowchart of a FinFET transistor cut etching process method in an embodiment of the present disclosure. FIGS. 4A-4H are schematic diagrams of sectional structures of the device in each step of the FinFET transistor cut etching process method in the embodiment of the present disclosure. The FinFET transistor cut etching process method in the embodiment of the present disclosure comprises the following steps.

Figure 4A:
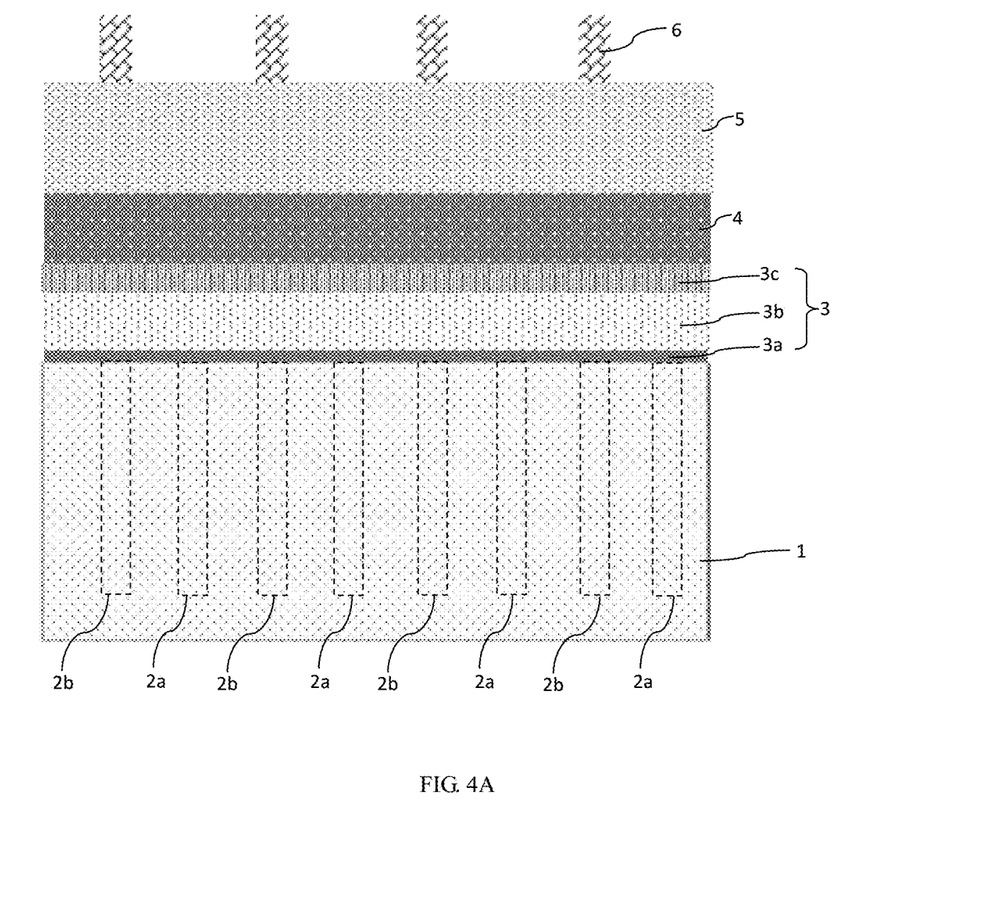
FIGS. 4A-4H are schematic diagrams of sectional structures of the device in each step of the FinFET transistor cut etching process method in the embodiment of the present disclosure.

Step 1, as shown in FIG. 4A, a semiconductor substrate 1 is provided, wherein a first hard mask 3 and a second amorphous semiconductor layer 4 are sequentially formed on the surface of the semiconductor substrate 1.

A first photoresist pattern is formed by means of a photolithographic process to define a cut etching region of the FinFET transistor, the first photoresist pattern is formed by an arrangement of a plurality of photoresist stripes 6, the cut etching region corresponds to a stripe region in which a fin 2 is removed, each fin 2 presents a strip structure, and in a plan view, the photoresist strip 6 and the fin 2 present an alternate arrangement structure. In FIG. 4A, the formation region of the fin 2 is represented by a dashed box 2a and the cut etching region is represented by a dashed box 2b.

Generally, a Tri-layer structure is used for forming the first photoresist pattern, and a reference numeral 5 in FIG. 4A represents a stacking structure of SOC and SiHM in the Tri-layer structure.

In the embodiment of the present disclosure, the semiconductor substrate 1 is a silicon substrate, and the material of the second amorphous semiconductor layer 4 is amorphous silicon.

The material of the first hard mask 3 includes an oxide layer or a nitride layer. Preferably, the first hard mask 3 includes a third oxide layer 3a, a fourth nitride layer 3b, and a fifth oxide layer 3c which are sequentially stacked.

Figure 4B:
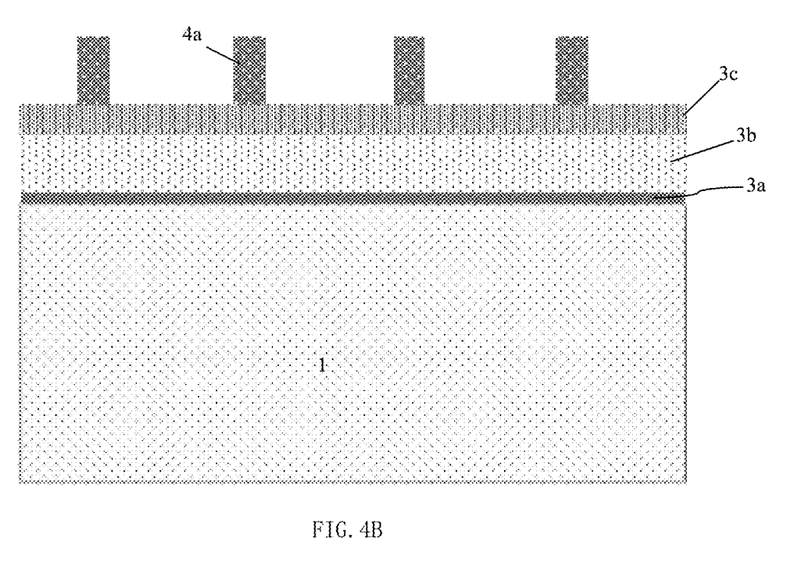

Step 2, as shown in FIG. 4B, the second amorphous semiconductor layer 4 is etched by using the first photoresist pattern as a mask, so as to form a second amorphous semiconductor pattern, wherein the second amorphous semiconductor pattern is formed by an arrangement of a plurality of amorphous semiconductor stripes 4a, and the amorphous semiconductor stripes 4a are defined by the photoresist stripes 6.

In step 2, the second amorphous semiconductor layer 4 is etched by means of a dry etching process.

Figure 4C:
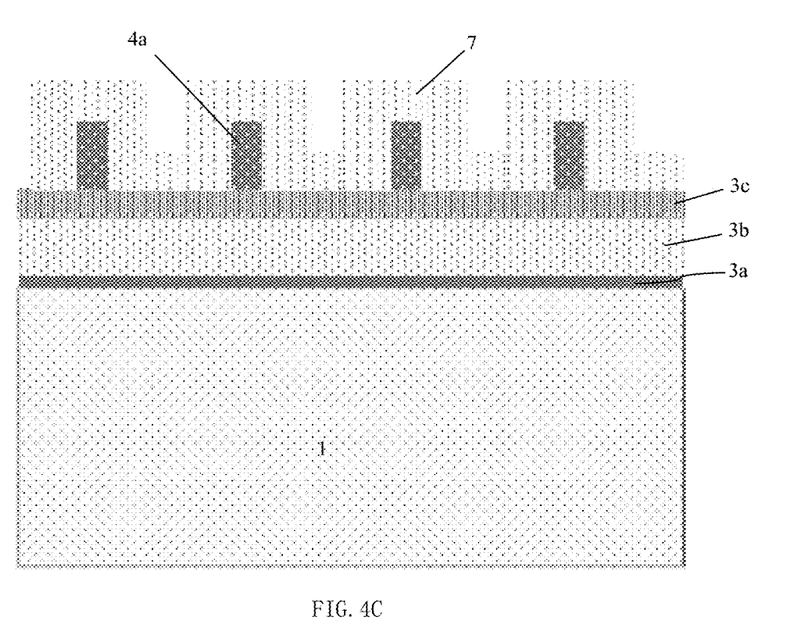

Step 3, as shown in FIG. 4C, a first dielectric layer 7 is formed, wherein the first dielectric layer 7 covers a top surface and a side surface of the amorphous semiconductor strip 4a, and a surface of the first hard mask 3 between the amorphous semiconductor strips 4a, and there is an interval between the first dielectric layers 7 on the side surfaces of the amorphous semiconductor strips 4a and a first groove is formed therefrom.

In the embodiment of the present disclosure, the first dielectric layer 7 is a nitride layer.

The thickness of the first dielectric layer 7 defines an interval between the fin 2 and the cut etching region, and said interval is equivalent to a corresponding interval between the two fins in the existing method. However, in the embodiment of the present disclosure, since the fin in the cut etching region is not directly formed, the thickness of the first dielectric layer 7 is used to define the interval between the fin 2 and the cut etching region. Preferably, the first dielectric layer 7 is grown by means of an atomic layer deposition method.

Figure 4D:
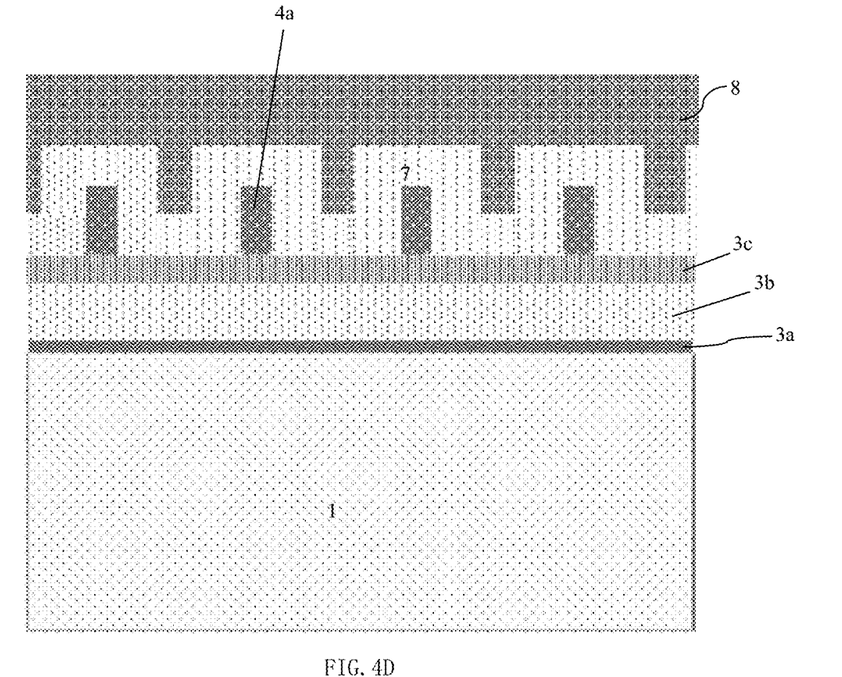

Step 4, as shown in FIG. 4D, a second dielectric layer 8 is formed, wherein the second dielectric layer fully fills the first groove and extends onto a surface of the first dielectric layer 7 outside the first groove.

In the embodiment of the present disclosure, the second dielectric layer 8 is an oxide layer. In other embodiments, other material that enables the first dielectric layer 7, the second dielectric layer 8, and the second amorphous semiconductor layer 4 to have an etching selection ratio can also be selected.

The second dielectric layer 8 is formed by means of a chemical vapor deposition process. Preferably, the second dielectric layer 8 can be formed by means of a chemical vapor deposition process with better fluidity, which is beneficial to the filling of the first groove.

Figure 4E:
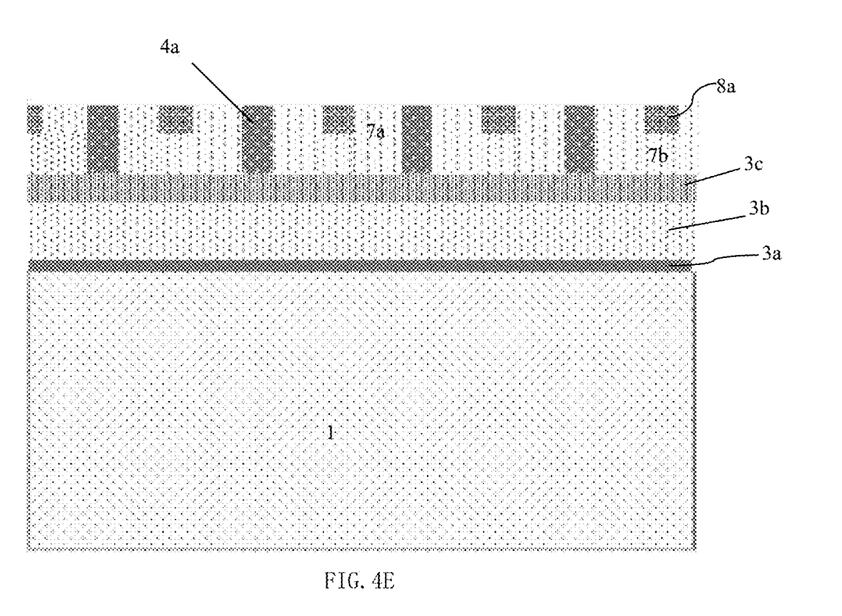

Step 5, planarization is performed by means of a chemical mechanical polishing process using the second amorphous semiconductor layer 4 as a stop layer, after the planarization, a side wall 7a composed of the first dielectric layer 7 is formed on a side surface of the amorphous semiconductor stripe 4a, and a second dielectric layer strip 8a composed of the second dielectric layer 8 filled in the first groove is formed between the side walls 7a, wherein the second dielectric layer strip 8a defines a corresponding formation region of fin 2. The first dielectric layer remaining on the bottom of the second dielectric layer strip 8a is marked with a reference numeral 7b.

Figure 4F:
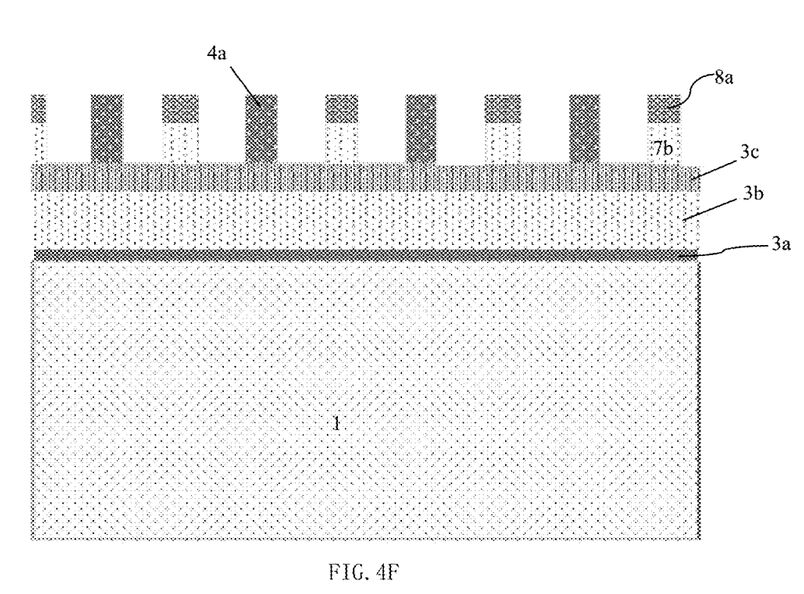

Step 6, as shown in FIG. 4F, self-alignment is performed by using each amorphous semiconductor strip 4a and each second dielectric layer strip 8a as masks, so as to remove each side wall 7a.

In the embodiment of the present disclosure, the side wall 7a is removed by means of a dry etching process.

Figure 4G:
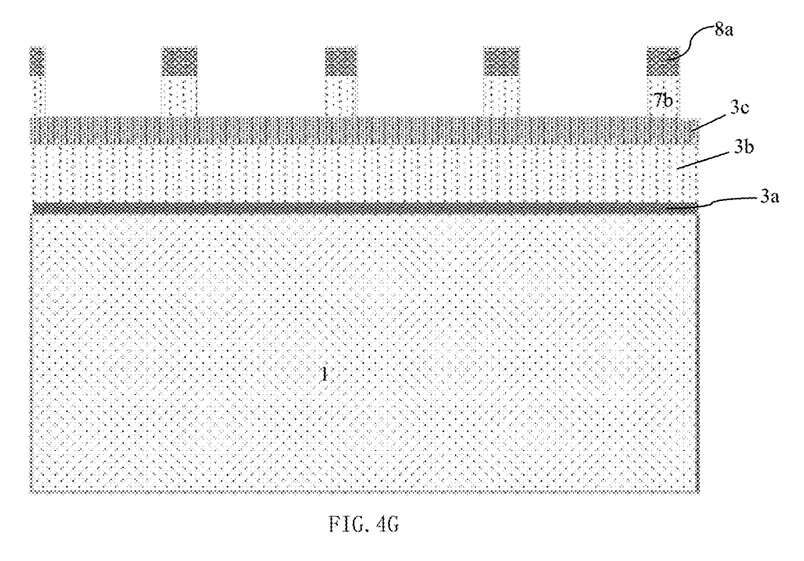

Step 7, as shown in FIG. 4G, a wet process is performed to remove each amorphous semiconductor strip 4a.

In the embodiment of the present disclosure, an etching solution of the wet process comprises TMAH and NH$_4$OH.

Figure 4H:
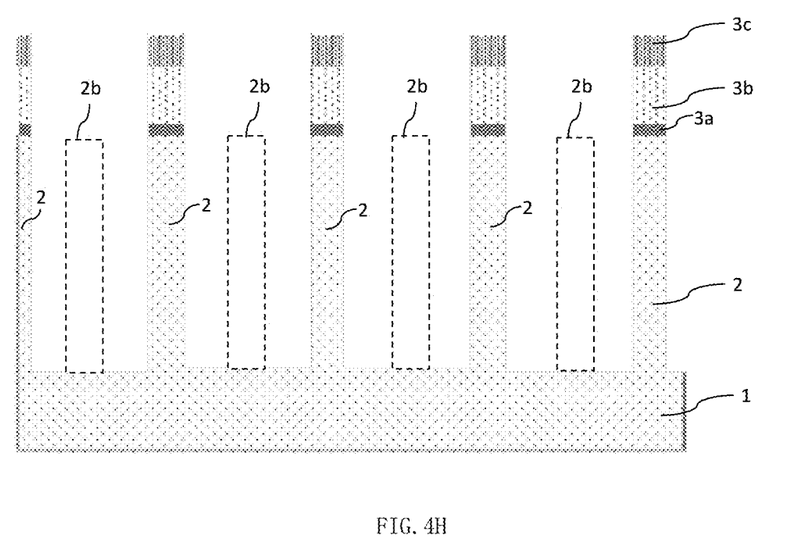

Step 8, as shown in FIG. 4H, the first hard mask 3 and the semiconductor substrate 1 are sequentially etched by using each second dielectric layer strip 8a as a mask, so as to form the fin 2 and achieve cut etching of the FinFET transistor.

In the embodiment of the present disclosure, the first hard mask 3 and the semiconductor substrate 1 are sequentially etched by means of a dry etching process.

The method further comprises a step of forming a gate structure of the FinFET transistor after step 8, the gate structure comprising a gate dielectric layer and a gate conductive material layer and covering a side surface and a top surface of the fin 2; and further comprises a step of forming a source region and a drain region in the fins 2 on two sides of the gate structure.

In the prior art, after a fin is formed by means of photolithographic defining and etching, a cut etching region of the FinFET transistor is defined by means of photolithography, and then the fin in the cut etching region is etched. Dissimilarly, in the present disclosure, photolithographic defining of the fin 2 is not performed directly, but defining of the cut etching region of the FinFET transistor is directly performed, the cut etching region is defined to be as the same as a strip pattern of the fin 2 that needs to be removed in the prior art, and then a reverse double patterning production process is performed to define the pattern mask composed of the amorphous semiconductor stripe 4a and the pattern mask composed of the second dielectric layer stripe 8a, wherein the pattern mask composed of the amorphous semiconductor stripe 4a, that is, the second amorphous semiconductor pattern, is formed by means of photolithographic defining and an etching process of the second amorphous semiconductor layer 4, and the pattern mask composed of the second dielectric layer stripe 8a is formed by first forming the first dielectric layer 7 and then performing filling of the second dielectric layer 8, the chemical mechanical polishing process, and the self-alignment removal process of the first dielectric layer 7; after a double patterning mask structure is formed, the amorphous semiconductor strip 4a can be removed by means of the wet process, and then etching of semiconductor substrate 1 is performed by means of the pattern mask composed of the second dielectric layer strip 8a, so as to form the fin 2 and achieve the cut etching of the FinFET transistor. It can be known from the above that the cut etching process in the embodiment of the present disclosure can be achieved by performing the photolithographic defining only once, and the pattern mask composed of the amorphous semiconductor stripe 4a corresponding to the cut etching region is removed by means of the wet process before the etching of the semiconductor substrate 1. Compared with the prior art in which an independent photolithography process is required to define the cut etching region and dry etching is required to remove the relatively high fin 2 in the cut etching region, the process window of the wet process for removing the amorphous semiconductor strip 4a in the embodiment of the present disclosure is greatly enlarged. Therefore, the embodiment of the present disclosure can enlarge the process window and reduce the process cost.

The present disclosure is expounded above with reference to the specific embodiments, but these embodiments are not intended to limit the disclosure. Various transformations and improvements made by those skilled in this field without deviating from the principle of the present disclosure should also fall within the protection scope of the present disclosure.

What is claimed is:

1. A FinFET transistor cut etching process method, comprising the following steps:

step 1, providing a semiconductor substrate, the semiconductor substrate having a surface where a first hard mask and a second amorphous semiconductor layer are sequentially formed thereon, and forming a first photoresist pattern by means of a photolithographic process to indirectly define a fin cut etching region of a FinFET transistor, wherein the first photoresist pattern is formed by an arrangement of a plurality of photoresist stripes, the first photoresist pattern directly defines a graphic structure of the second amorphous semiconductor layer, an area covered by first photoresist stripes is a reserved area of the second amorphous semiconductor layer, and an area between the first photoresist stripes is a removed area of the second amorphous semiconductor layer, the first photoresist pattern is configured to be removed before a subsequent etching of the semiconductor substrate, and the first photoresist pattern is configured to be transferred to the semiconductor substrate after the subsequent etching of the semiconductor substrate, thereby realizing an indirect definition of the fin cut etching region in advance, the fin cut etching region is located in the semiconductor substrate and corresponds to a stripe region in which a fin is removed, each fin presents a strip structure, and, in a plan view, a subsequently formed fin cut etching region and the fin present an alternate arrangement structure;

step 2, etching the second amorphous semiconductor layer by using the first photoresist pattern as a mask, so as to form a second amorphous semiconductor pattern, wherein the second amorphous semiconductor pattern is formed by an arrangement of a plurality of amorphous semiconductor stripes, and the amorphous semiconductor stripes are defined by the photoresist stripes; then, removing the first photoresist pattern;

step 3, forming a first dielectric layer, wherein the first dielectric layer covers a top surface and a side surface of the amorphous semiconductor stripe, and a surface of the first hard mask between the amorphous semiconductor stripes, and there is an interval between the first dielectric layers on side surfaces of the amorphous semiconductor stripes and a first groove is formed therefrom;

step 4, forming a second dielectric layer, wherein the second dielectric layer fully fills the first groove and extends onto a surface of the first dielectric layer outside the first groove;

step 5, performing planarization by means of a chemical mechanical polishing process using the second amorphous semiconductor layer as a stop layer, after the planarization, forming a side wall composed of the first dielectric layer on the side surface of the amorphous semiconductor stripe, and forming a second dielectric layer stripe composed of the second dielectric layer filled in the first groove between the side walls, wherein the second dielectric layer stripe defines a corresponding formation region of a fin;

step 6, performing self-alignment by using each amorphous semiconductor stripe and each second dielectric layer stripe as masks, so as to remove each side wall;

step 7, performing a wet process to remove each amorphous semiconductor stripe, taking advantage of a characteristics that materials of the amorphous semiconductor stripe and the first hard mask are different, the materials of the amorphous semiconductor stripe and the first dielectric layer are different, and the materials of amorphous semiconductor stripe and the second dielectric layer are different, all of the amorphous semiconductor stripes are removed, without a need to use photolithography; and step 8, sequentially etching the first hard mask and the semiconductor substrate by using each second dielectric layer stripe as a mask, so as to form the fin and achieve cut etching of the FinFET transistor to form the fin cut etching region, a forming area of the fin is the area covered by the second dielectric layer stripe, the fin cut etching region is located in the area covered by the amorphous semiconductor strip, and an interval area between the fin and the fin cut etching region is located in the area covered by the side wall.

2. The FinFET transistor cut etching process method according to claim 1, wherein the semiconductor substrate is a silicon substrate.

3. The FinFET transistor cut etching process method according to claim 2, wherein a material of the second amorphous semiconductor layer is amorphous silicon.

4. The FinFET transistor cut etching process method according to claim 3, wherein a material of the first hard mask comprises an oxide layer or a nitride layer.

5. The FinFET transistor cut etching process method according to claim 4, wherein the first hard mask comprises a third oxide layer, a fourth nitride layer, and a fifth oxide layer which are sequentially stacked.

6. The FinFET transistor cut etching process method according to claim 5, wherein the first dielectric layer is a nitride layer.

7. The FinFET transistor cut etching process method according to claim 6, wherein the second dielectric layer is an oxide layer.

8. The FinFET transistor cut etching process method according to claim 1, wherein, in step 2, the second amorphous semiconductor layer is etched by means of a dry etching process.

9. The FinFET transistor cut etching process method according to claim 1, wherein, in step 3, a thickness of the first dielectric layer defines an interval between the fin and the fin cut etching region.

10. The FinFET transistor cut etching process method according to claim 9, wherein, in step 3, the first dielectric layer is grown by means of an atomic layer deposition method.

11. The FinFET transistor cut etching process method according to claim 1, wherein, in step 4, the second dielectric layer is formed by means of a chemical vapor deposition process.

12. The FinFET transistor cut etching process method according to claim 1, wherein, in step 6, the side wall is removed by means of a dry etching process.

13. The FinFET transistor cut etching process method according to claim 1, wherein, in step 8, the first hard mask and the semiconductor substrate are sequentially etched by means of a dry etching process.

14. The FinFET transistor cut etching process method according to claim 3, wherein, in step 7, an etching solution of the wet process comprises TMAH and $NH_4OH$.

15. The FinFET transistor cut etching process method according to claim 1, further comprising a step of forming a gate structure of the FinFET transistor after step 8, the gate structure comprising a gate dielectric layer and a gate conductive material layer and covering a side surface and a top surface of the fin; and further comprising a step of forming a source region and a drain region in fins on two sides of the gate structure.

* * * * *